United States Patent [19]

Shibata

[11] Patent Number: 5,436,198
[45] Date of Patent: Jul. 25, 1995

[54] METHOD OF MANUFACTURING SEMICONDUCTOR DEVICE HAVING STRAIGHT WALL BUMP

[75] Inventor: Kazutaka Shibata, Kyoto, Japan

[73] Assignee: Rohm Co., Ltd., Kyoto, Japan

[21] Appl. No.: 214,655

[22] Filed: Mar. 11, 1994

Related U.S. Application Data

[62] Division of Ser. No. 919,889, Jul. 27, 1992, abandoned.

[30] Foreign Application Priority Data

Sep. 9, 1991 [JP] Japan ................................. 3-258611

[51] Int. Cl.⁶ ........................................... H01L 21/441
[52] U.S. Cl. ................................. 437/183; 437/190
[58] Field of Search ............... 437/183, 189, 190, 203; 257/629

[56] References Cited

U.S. PATENT DOCUMENTS 5,244,833 9/1993 Gensauge et al. .................. 437/183
5,270,253 12/1993 Arai et al. ........................... 437/183

FOREIGN PATENT DOCUMENTS 2-230741 9/1990 Japan .
3-22437 1/1991 Japan .
567620 3/1993 Japan ................................. 437/183

*Primary Examiner*—Olik Chaudhuri
*Assistant Examiner*—S. Mulpuri
*Attorney, Agent, or Firm*—Brumbaugh, Graves, Donohue & Raymond

[57] ABSTRACT

A remaining layer obtained by etching away a half of a resist layer along its depth direction which functions as a mask when a straight wall type bump is formed, is employed as a protection layer for a semiconductor element, so that the surface protection of the semiconductor element can be simply achieved.

1 Claim, 3 Drawing Sheets

METHOD OF MANUFACTURING SEMICONDUCTOR DEVICE HAVING STRAIGHT WALL BUMP

This application is a division of application Ser. No. 07/919,889, filed on Jul. 27, 1992, now abandoned.

BACKGROUND OF THE INVENTION

The present invention generally relates to a semiconductor device utilized in the TAB (Tape Automated Bonding) technique. More specifically, the present invention relates to a semiconductor device having a straight wall type bump, and also a manufacturing method thereof.

Referring now to FIG. 4, a description will be made of a conventional method for manufacturing a semiconductor device having a straight wall type bump.

In FIG. 4(a), both an electrode layer 2 and a protection film 3 are formed as predetermined patterns on a contact portion of a circuit element of a semiconductor substrate 1 (simply referred to as "substrate" hereinafter). Then, a barrier metal layer 4 is coated over an entire surface of the substrate. In FIG. 4(b), a thick resist layer 5 is applied onto the barrier metal layer 4, and then, this resist layer 5 is opened to define a contact region (namely, a bump forming region). In FIG. 4(c), a bump 6 is formed at the opened portion by way of the electrolytic plating, while using the above-described resist layer 5 as a mask. At this time, the barrier metal layer 4 coated over the entire surface of the substrate 1, functions as a common electrode. Then, in FIG. 4(d), the resist layer 5 is removed. In FIG. 4(e), another resist layer 7 functioning as another mask used to etch the barrier metal layer 4 is formed. Subsequently, in FIG. 4(f), after the barrier metal layer 4 is etched away while using the above-explained resist layer 7 as a mask, this resist layer 7 is removed. In accordance with the above-described processing steps, a straight wall type bump 6 is fabricated on the substrate 1.

However, the conventional semiconductor device with the above-described structure has the following problems.

That is to say, after the substrate on which the bump has been formed in accordance with the above-described manufacturing steps is separated/cut off in separate elements, these separated elements are connected to a film carrier by utilizing the well known wireless bonding technique for gang connections. Then, an epoxy resin or the like is potted to the elements connected to the film carrier. Thus, the respective elements are sealed by the epoxy resin. However, since this type of semiconductor device must be made very thin, sufficient moisture resistance can be hardly expected with employment of only such a sealing epoxy resin. Accordingly, although a specific protection film could be independently formed on the semiconductor elements, there is another problem that if a process step for forming such a specific protection film is additionally introduced into a series of the above-described manufacturing process, the entire manufacturing process becomes cumbersome and also the manufacturing cost is increased.

SUMMARY OF THE INVENTION

The present invention has been made to solve the above-described problem, and therefore, has an object to provide a semiconductor device and a method for manufacturing such a semiconductor device in which surface protection of a semiconductor element having a straight wall type bump can be realized in a relatively simple manner.

To achieve such an object, the present invention is characterized by employing the following structure.

A semiconductor device of the present invention comprises a remaining layer, as a protection layer for a semiconductor element, which is obtained by etching away a half of a resist layer along its depth direction used as a mask while a straight wall type bump is formed.

Also, according to the present invention, a method for manufacturing a semiconductor device having a straight wall type bump, comprising: a first etching operation step for patterning at least one of an electrode layer formed on a semiconductor substrate and a barrier metal layer formed on the electrode layer in such a manner that either the electrode layer or the barrier metal layer is conducted to a common electrode used for electrolytic plating during formation of the bump; a mask forming step for forming on the etched semiconductor substrate, a resist layer functioning as a mask during the formation of the bump; a bump forming step for forming the bump on the semiconductor substrate by way of electrolytic plating, while using the resist layer as a mask; and a second etching operation step for etching away a half of the resist layer along its depth direction on the semiconductor substrate on which the bump has been formed.

The effects of the present invention are achieved as follows.

First, in accordance with the semiconductor device of the present invention, since the remaining layer obtained by etching away a half of the resist layer along its depth direction, which is used as the mask while the straight wall type bump is formed, is employed as the protection layer for the semiconductor element, reliability of such a sort of semiconductor element can be improved.

Furthermore, in accordance with the method for manufacturing the semiconductor device of the present invention, since at least one of the electrode layer formed on the semiconductor layer, and the barrier metal layer formed on the electrode layer is previously patterned in such a manner that either the electrode layer or the barrier metal layer is connected with the common electrode used for electrolytic plating during the formation of the bump, such an element structure can be easily realized that a half of the above-described resist layer is etched away along its depth direction, whereby the remaining layer is used as the protection layer, as compared with the conventional semiconductor device manufacturing method in which the resist layer functions as the mask during the formation of the bump must be removed to etch away the barrier metal layer.

DETAILED DESCRIPTION OF THE INVENTION

Figure 1A:
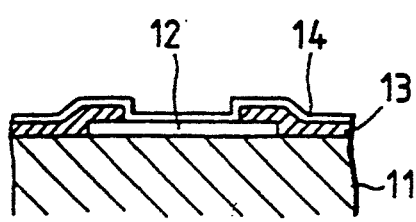
FIGS. 1(a) to 1(f) are sectional views of an element, in which a manufacturing method of a semiconductor device according to an embodiment of the present invention is pictorically shown.

Referring now to the drawings, an embodiment of the present invention will be described.

FIGS. 1(a) to 1(f) are sectional views of a semiconductor element, by which a sequential step of a method for manufacturing a semiconductor device according to the present invention is represented. In FIG. 1(a), an electrode layer 12 of aluminum or the like and a protection film 13 such as a silicon oxide film are formed in a predetermined pattern on a contact portion of a circuit element made on, for instance, a silicon substrate 11. Then, a barrier metal layer 14 is coated on the electrode layer and the protection film in such a manner that an overall surface of the substrate may be covered with this barrier metal layer. For example, a chromium film, a titanium film or the like are employed as the barrier metal layer 14.

Figure 1D:
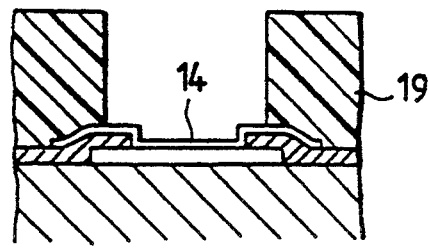
Figure 1B:
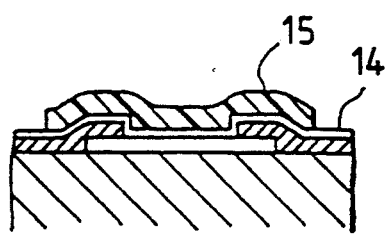
Figure 1E:
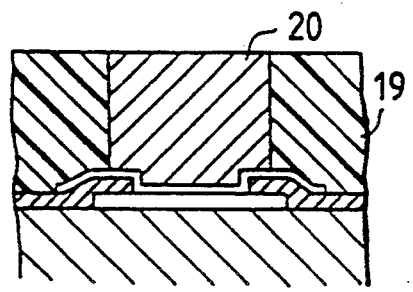
Figure 1C:
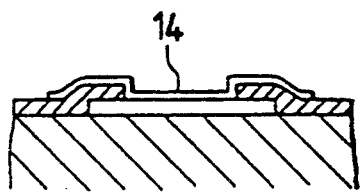
Figure 2:
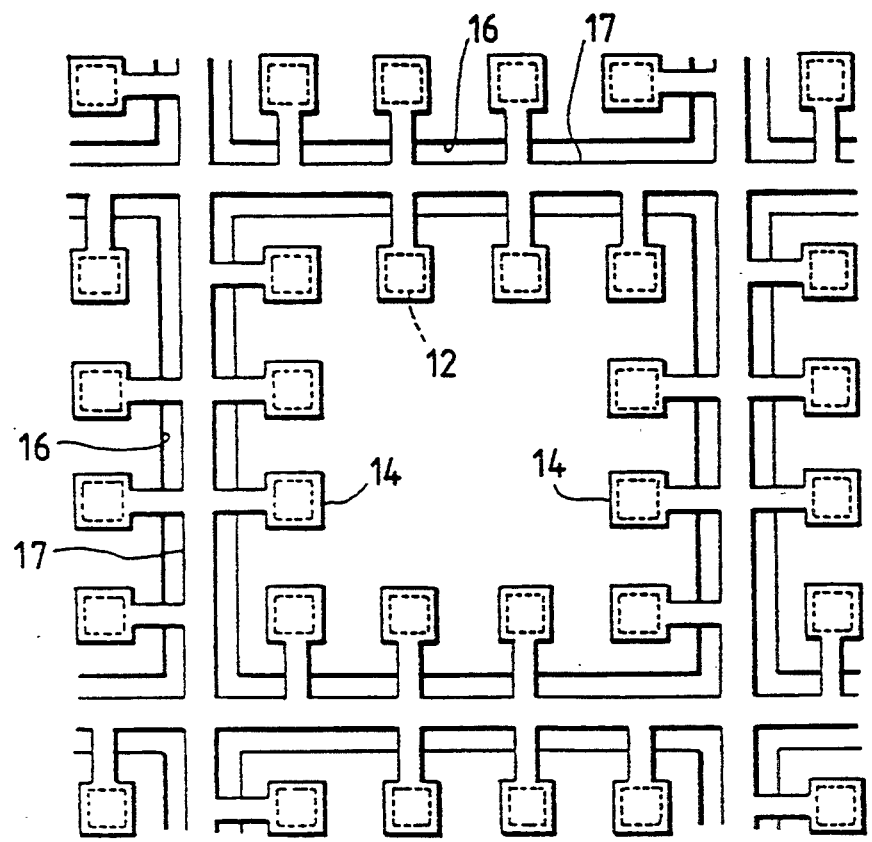
FIG. 2 is a plan view of a semiconductor element patterned during a step of a first etching process.
Figure 3:
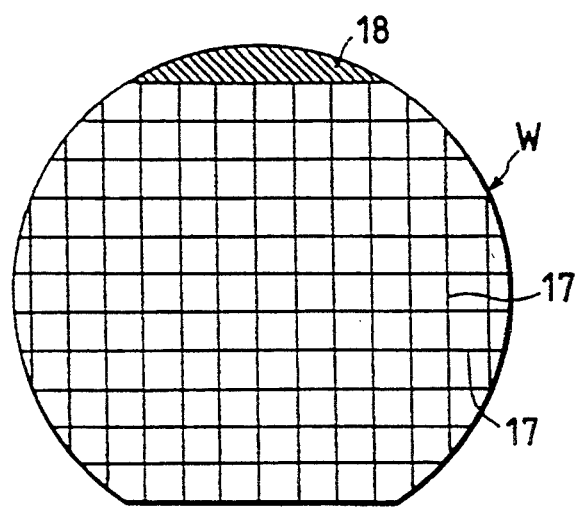
FIG. 3 is a plan view of an example where wiring lines are connected to a common electrode used for electrolytic plating.
Figure 4A:
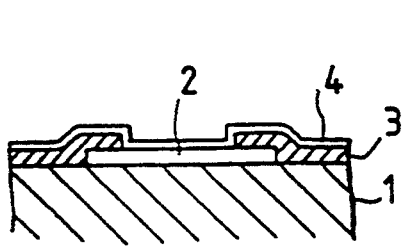
FIGS. 4(a) to 4(f) are sectional views of an element, in which a conventional manufacturing step is shown.
Figure 4B:
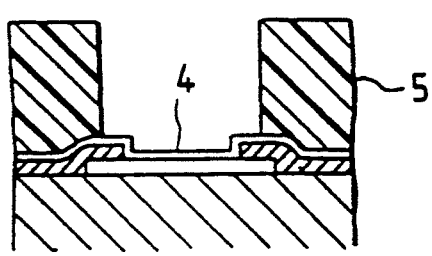
Figure 4C:
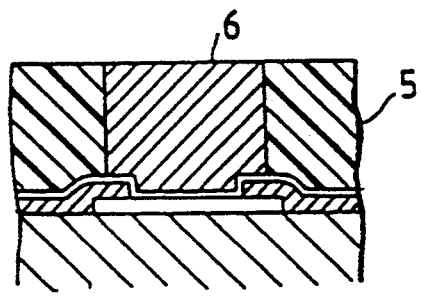
Figure 4D:
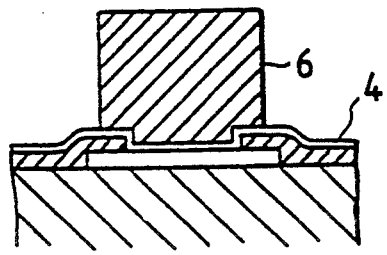
Figure 4E:
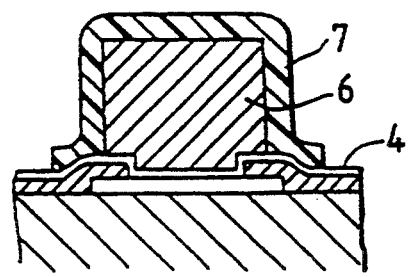
Figure 4F:
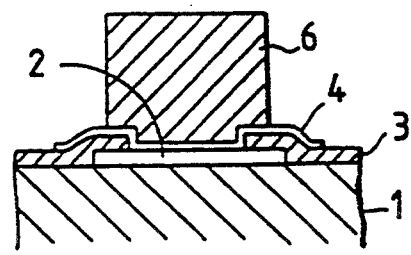

FIGS. 1(b) and 1(c) correspond to a step of a first etching process according to a method of the present invention. In this step, the barrier metal layer 14 is etched in such a manner that the barrier metal layer is conducted to a common electrode used for electrolytic plating when a bump is formed, while utilizing a resist layer 15 as a mask. In a concrete example, as shown in FIG. 2, the respective barrier metal layers 14 which have been etched in such a way that the electrode layers 12 are covered with these barrier metal layers 14, are mutually connected with each other by wiring lines (conductor lines) 17 which have been formed on scribe lines 16 along horizontal and vertical directions by the same etching process as that of the barrier metal layers. Then, as represented in FIG. 3, these wiring lines 17 are connected to a common electrode 18 used for the electrolytic plating, which has been fabricated around a wafer "W". It should be noted that although the common electrode 18 is formed on a portion of a peripheral region of the wafer "W" illustrated in FIG. 3, the common electrode 18 may be alternatively formed in a ring shape along this peripheral region.

FIG. 1(d) corresponds to a mask forming step in accordance with the method of the present invention. A thick resist layer 19 which will function as a mask during electrolytic plating, is formed on the barrier metal layer 14 which has been patterned, and also a contact region (namely, bump forming region) is formed by opening this thick resist layer 19. The resist layer 19 is preferably made of, for instance, a polyimide resin or the like, and a thickness thereof is selected to be on the order of 20 to 50 μm.

FIG. 1(e) corresponds to a bump forming step according to the method of the present invention, in which a bump 20 is fabricated by the electrolytic plating method, while utilizing the above-described resist layer 19 as a mask. As a material of this bump 20, either gold (Au), copper (Cu), or the like is employed. At this time, although the barrier metal layers 14 have been patterned, as described above, since the respective barrier metal layers 14 are connected to the common electrode 18, the bump 20 can be fabricated without giving adverse influences to the respective contact regions.

Figure 1F:
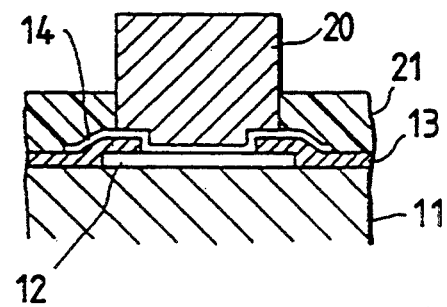

FIG. 1(f) corresponds to a step of a second etching process according to the method of the present invention, and represents that only a half of the resist layer 19 which functioned as a mask during formation of the bump is etched away along its depth direction, and then a remaining layer 21 is left as a protection layer for the semiconductor element. In case that the resist layer 19 is made of a polyimide resin, since this resist layer 19 can be etched by an aqueous solution of sodium hydroxide (NaOH), the resist layer 19 may be left by, for instance, approximately 10 μm, while controlling the etching time thereof.

In accordance with the present embodiment of the invention, the barrier metal layer 14 is connected to the common layer 18. Alternatively, the electrode layer 12 may be connected to the common electrode 18, instead of the barrier metal layer 14.

Furthermore, a polyimide resin has been used as the resist layer 19 in the above-described embodiment. However, the present invention is not limited thereto, but may be modified in such a way that any resin may be employed as long as the resin has superior characteristics of adhesion to the semiconductor element and moisture resistance.

As apparent from the foregoing descriptions, in accordance with the semiconductor device of the present invention, since the remaining layers which are obtained by etching away a half of the resist layer functioning as the mask during formation of the straight wall type bump, are employed as the protection layers for the semiconductor element, even when such a semiconductor element is mounted on a film carrier and the like, reliability of this semiconductor device can be improved with respect to the moisture resistance and the like, as compared with the conventional semiconductor device.

Also, in accordance with the manufacturing method of the semiconductor device according to the present invention, since at least one of the electrode layer on the semiconductor substrate and the barrier metal layer thereon is previously patterned in such a manner that the patterned layer may be connected to the common electrode used for electrolytic plating during formation of the bump, the semiconductor device may be readily realized according to the present invention without removing the resist layer functioning as the mask during formation of the bump to etch the barrier metal layer, as required in the conventional manufacturing method.

What is claimed is:

1. A method for manufacturing a semiconductor device having straight wall-type metal contact electrode bumps comprising:
   providing a semiconductor substrate having a metal layer;
   etching the metal layer on the semiconductor substrate to provide a plurality of contact electrodes connected to a common electrode;
   applying an insulating resist layer to the substrate and the electrodes;
   forming a mask with the resist layer to expose the plurality of contact electrodes and the common electrode;
   forming a plurality of metal contact electrode straight wall bumps on the plurality of contact electrodes by electrolytic plating using the common electrode as an electrolytic plating electrode and using the resist layer as a mask; and
   etching the resist layer to reduce its thickness to approximately one-half the height of the metal contact electrode bumps while retaining approximately one-half of the original thickness of the resist layer to provide a permanent protection layer for the semiconductor substrate.

* * * * *